(12) United States Patent
Takazane (10) Patent No.: US 10,186,834 B2
(45) Date of Patent: Jan. 22, 2019

(54) LASER OSCILLATOR (71) Applicant: FANUC CORPORATION, Yamanashi (JP)

(72) Inventor: Tetsuhisa Takazane, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/719,946

(22) Filed: Sep. 29, 2017

(65) Prior Publication Data

US 2018/0109072 A1 Apr. 19, 2018

(30) Foreign Application Priority Data

Oct. 17, 2016 (JP) .................. 2016-203743

(51) Int. Cl.
*H01S 3/00* (2006.01)
*H01S 5/026* (2006.01)
(Continued)

(52) U.S. Cl.
CPC .......... *H01S 5/02288* (2013.01); *H01S 5/005* (2013.01); *H01S 5/02252* (2013.01); *H01S 5/02284* (2013.01); *H01S 5/02415* (2013.01); *H01S 5/02438* (2013.01); *H01S 5/02446* (2013.01); *H01S 5/042* (2013.01); *H01S 5/4012* (2013.01); *H01S 5/02216* (2013.01)

(58) Field of Classification Search
CPC ...... H01S 5/02252; H01S 5/06; H01S 5/4012; H01S 3/30
USPC .... 372/34, 36, 50.12, 35, 101; 359/641, 627
See application file for complete search history.

(56) References Cited

U.S. PATENT DOCUMENTS 6,044,096 A * 3/2000 Wolak .................... G02B 27/09
372/109
6,124,973 A 9/2000 Du et al.
(Continued)

FOREIGN PATENT DOCUMENTS

JP 2003-298171 A 10/2003
JP 2004-252423 A 9/2004
(Continued)

OTHER PUBLICATIONS

Notification of Reasons for Refusal dated Jan. 23, 2018, from corresponding JP Appl No. 2016-203743, 1 pp.
(Continued)

*Primary Examiner* — Tuan Nguyen
(74) *Attorney, Agent, or Firm* — Studebaker & Brackett PC (57) ABSTRACT

To provide a laser oscillator allowing the use of a plastic lens in a semiconductor laser module for a high-output laser oscillator while being unlikely to reduce the efficiency of coupling to an optical fiber even if a laser output changes. A laser oscillator comprises a semiconductor laser module with multiple semiconductor laser elements. The laser oscillator comprises: multiple lenses in a first group provided in the semiconductor laser module for causing laser beams from the semiconductor laser elements to pass through; and a lens in a second group provided in the semiconductor laser module for causing all beams having passed through the multiple lenses in the first group to pass through. The lenses in the first group are plastic lenses. The lens in the second group is a glass lens.

20 Claims, 6 Drawing Sheets (51) Int. Cl.
*G02B 27/14* (2006.01)
*H01S 5/022* (2006.01)
*H01S 5/024* (2006.01)
*H01S 5/042* (2006.01)
*H01S 5/40* (2006.01)
*H01S 5/00* (2006.01)

(56) References Cited

U.S. PATENT DOCUMENTS

| | | | | |
|---|---|---|---|---|
| 6,845,121 | B2* | 1/2005 | McDonald | G02B 6/2746 |
| | | | | 372/34 |
| 8,427,749 | B2* | 4/2013 | Du | H01S 5/4012 |
| | | | | 359/618 |
| 9,373,932 | B2 | 6/2016 | Hayamizu et al. | |
| 2002/0090172 | A1 | 7/2002 | Okazaki et al. | |
| 2003/0231690 | A1 | 12/2003 | McDonald | |
| 2004/0027631 | A1* | 2/2004 | Nagano | G02B 6/4206 |
| | | | | 372/36 |
| 2004/0252388 | A1 | 12/2004 | Yamanaka et al. | |
| 2005/0078720 | A1* | 4/2005 | Walker, Jr. | H01S 5/02288 |
| | | | | 372/36 |
| 2006/0222042 | A1* | 10/2006 | Teramura | G02B 7/025 |
| | | | | 372/101 |
| 2006/0239317 | A1* | 10/2006 | Yoshida | G02B 6/4204 |
| | | | | 372/36 |
| 2008/0226229 | A1* | 9/2008 | Nakagawa | G02B 6/327 |
| | | | | 385/33 |
| 2009/0245315 | A1* | 10/2009 | Faybishenko | G02B 6/4206 |
| | | | | 372/50.12 |
| 2009/0323752 | A1* | 12/2009 | Chuyanov | G02B 6/4206 |
| | | | | 372/50.12 |
| 2015/0131692 | A1* | 5/2015 | Hayamizu | G02B 6/4206 |
| | | | | 372/107 |

FOREIGN PATENT DOCUMENTS

| | | |
|---|---|---|
| JP | 2004-252425 A | 9/2004 |
| JP | 2007-047433 A | 2/2007 |
| JP | 2010-161204 A | 7/2010 |
| JP | 2013-235943 A | 11/2013 |

OTHER PUBLICATIONS

An Office Action mailed by the State Intellectual Property Office dated Sep. 30, 2018, which corresponds to Chinese Patent Application No. 201710948590.4 and is related to U.S. Appl. No. 15/719,946.

* cited by examiner

FIG. 10

LASER OSCILLATOR

This application is based on and claims the benefit of priority from Japanese Patent Application No. 2016-203743, filed on 17 Oct. 2016, the content of which is incorporated herein by reference.

BACKGROUND OF THE INVENTION

Field of the Invention

The present invention relates to a laser oscillator with a semiconductor laser module.

Related Art

A laser oscillator used for cutting of metal or plastic materials or welding includes a semiconductor laser module functioning as a light source or an excitation light source. The semiconductor laser module supplies a laser to a resonator, for example, by coupling (optically coupling) a laser beam emitted from a semiconductor laser element to an optical fiber or by causing the laser beam to propagate through space.

A lens or a mirror is used as an optical system for coupling between a semiconductor laser element and an optical fiber. A lens is generally made of glass for the following reason. A glass lens satisfies the requirements of having high heat resistance and only exhibiting small changes in optical characteristics as temperature changes. On the other hand, a plastic lens can be molded relatively easily. Thus, the shape of a plastic lens can be designed almost freely. For example, a plastic lens can be molded into an aspherical shape with a curvature differing between a vertical direction and a horizontal direction. Additionally, a plastic lens allows integral molding of an attachment member and a heat dissipation mechanism.

A structure for coupling a semiconductor laser element of a semiconductor laser module to an optical fiber has conventionally been suggested (see patent document 1, for example). Patent document 1 suggests a technique of increasing adhesion by using glass for forming a mirror and also for forming a wall member of the semiconductor laser module.

There has also been a suggested technique relating to an optical module with a package sealed with a resin molded body (see patent document 2, for example). According to this technique, lens surfaces each having a focusing function are formed at at least two positions of a boundary between resin and gas on the optical axis of a semiconductor optical element, thereby increasing a degree of optical coupling without using a glass lens.

There has also been a suggested technique responsive to changes in optical characteristics corresponding to a change in temperature occurring in a semiconductor laser module (see patent document 3, for example). According to this technique, two lenses including a microsphere lens and a plastic lens are used. To reduce a change in coupling efficiency caused by a change in temperature, the optical axes of the lenses, etc. are adjusted at a temperature of 25 degrees C. or more.

Patent Document 1: Japanese Unexamined Patent Application, Publication No. 2013-235943
Patent Document 2: Japanese Unexamined Patent Application, Publication No. 2010-161204
Patent Document 3: Japanese Unexamined Patent Application, Publication No. 2007-047433

SUMMARY OF THE INVENTION

The technique described in patent document 1 is to increase adhesion by using glass for forming all optical members and also for forming the wall member of the semiconductor laser module. However, patent document 1 does not mention the use of a plastic lens or a mirror.

The technique described in patent document 2 relates to a semiconductor laser module that performs transmission and reception through optical communication. This semiconductor laser module produces a laser output of several milliwatts. In contrast, a semiconductor laser module for a laser oscillator used for cutting of metal or plastic materials or welding produces a laser output of several tens to several hundreds of watts. Hence, specifications required for this semiconductor laser module are completely different from those required for a semiconductor laser module for optical communication. Further, these semiconductor laser modules have different specific structures. Namely, the technique for optical communication described in patent document 2 is based on the assumption that it is used in a low laser output range. Hence, the application of a plastic lens has been considered. More specifically, this application is to compensate for the low refractive index of plastic by using two plastic lenses. However, patent document 2 does not mention heat resistance or changes in optical characteristics corresponding to a change in temperature, which become problematic issues in high-output lasers.

According to the technique described in patent document 3, the optical axes of the lenses, etc. are adjusted at a temperature of 25 degrees C. or more. However, this technique also does not provide means for sufficiently responding to heat resistance or changes in optical characteristics corresponding to a change in temperature, which become problematic issues in high-output lasers.

As described above, all the techniques of patent documents 1 to 3 are suited to low-output laser oscillators. Hence, patent documents 1 to 3 disclose nothing about a method of using a plastic lens in a semiconductor laser module for a laser oscillator that produces an output of several tens to several hundreds of watts for purposes of cutting of metal or plastic materials, welding, etc. Specifically, if a plastic lens is used in a high-output laser oscillator as might have been done conventionally, temperature changes in response to a laser output changes optical characteristics. In this case, the efficiency of coupling to an optical fiber is reduced. However, a method of solving this problem has yet to be found.

The present invention has been made in view of the above-described circumstances. It is an object of the present invention to provide a laser oscillator allowing the use of a plastic lens in a semiconductor laser module for a high-output laser oscillator, while being unlikely to reduce the efficiency of coupling to an optical fiber even if a laser output changes.

(1) A laser oscillator (laser oscillator 1 or 1*a* described later, for example) according to the present invention comprises a semiconductor laser module (semiconductor laser module 10, 10*a*, or 10*b* described later, for example) with multiple semiconductor laser elements (semiconductor laser elements 3 (301, 302, 303) described later, for example). The laser oscillator comprises: multiple lenses in a first group (lenses 400 (401, 402, 403) described later, for example) provided in the semiconductor laser module for causing laser beams from the semiconductor laser elements to pass through; and a lens in a second group (lens 600 (610) described later, for example) provided in the semiconductor laser module for causing all beams that have already passed through the multiple lenses in the first group to pass through. The lenses in the first group are plastic lenses and the lens in the second group is a glass lens.

(2) In one aspect of the laser oscillator described in (1), the semiconductor laser module may further include a mirror (mirror 500 (501, 502, 503) described later, for example) for reflecting a laser beam from each of the semiconductor laser elements. A lens in the first group may be integrated with the mirror so as to form one component.

(3) In one aspect of the laser oscillator described in (1) or (2), the laser oscillator may comprise a semiconductor laser element temperature adjustment unit (semiconductor laser element temperature adjustment unit 61 described later, for example) for temperature adjustment of the semiconductor laser elements, and a lens temperature adjustment unit (lens temperature adjustment unit 62 described later, for example) for temperature adjustment of the lenses in the first group and/or the lens in the second group. The lens temperature adjustment unit may be configured to control the temperatures of the lenses in response to an output from each of the semiconductor laser elements independently of the semiconductor laser element temperature adjustment unit.

(4) In one aspect of the laser oscillator described in any one of (1) to (3), the semiconductor laser module may include multiple semiconductor laser modules, the laser oscillator may comprise a module drive unit (module drive unit 110 described later, for example) for driving the multiple semiconductor laser modules individually, and the module drive unit may be configured to apply two control modes selectively to each of the multiple semiconductor laser modules and execute the applied mode. The two control modes include a rated drive mode of driving each of the semiconductor laser modules so as to make each of the semiconductor laser modules produce a rated output, and a stop mode of not driving each of the semiconductor laser modules.

(5) In one aspect of the laser oscillator described in any one of (1) to (3), the semiconductor laser module may include multiple semiconductor laser modules, the laser oscillator may comprise a module drive unit (module drive unit 110 described later, for example) for driving the multiple semiconductor laser modules individually, and the module drive unit may be configured to apply two control modes selectively to each of the multiple semiconductor laser modules and execute the applied mode. The two control modes include a near rated drive mode of driving each of the semiconductor laser modules so as to make each of the semiconductor laser modules produce an output near a rated output, and a stop mode of not driving each of the semiconductor laser modules.

(6) In one aspect of the laser oscillator described in (4) or (5), the multiple semiconductor laser modules may include semiconductor laser modules of different rated outputs to form a semiconductor laser module group.

(7) In one aspect of the laser oscillator described in any one of (1) to (3), the semiconductor laser module may include multiple semiconductor laser elements (semiconductor laser elements 301, 302 and 303 described later, for example), and a semiconductor laser element drive unit (semiconductor laser element drive unit 310 described later, for example) for driving the multiple semiconductor laser elements individually. The semiconductor laser element drive unit may be configured to apply two control modes selectively to each of the multiple semiconductor laser elements and execute the applied mode. The two control modes include a rated drive of driving each of the semiconductor laser elements so as to make each of the semiconductor laser elements produce a rated output, and a stop mode of not driving each of the semiconductor laser elements.

(8) In one aspect of the laser oscillator described in any one of (1) to (7), the position of each of the semiconductor laser elements mounted on the semiconductor laser module and that of a corresponding lens from the lenses in the first group mounted on the semiconductor laser module relative to each other may be set so as to achieve maximum coupling efficiency when the semiconductor laser module produces a rated output.

A laser oscillator that can be provided in the present invention allows the use of a plastic lens in a semiconductor laser module for a high-output laser oscillator, while being unlikely to reduce the efficiency of coupling to an optical fiber even if a laser output changes.

DETAILED DESCRIPTION OF THE INVENTION

Figure 1:
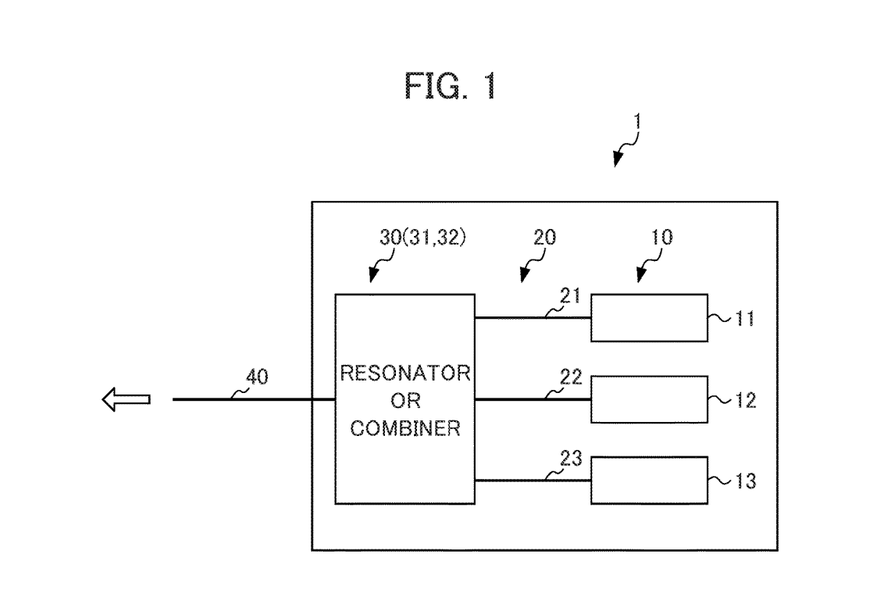
FIG. 1 is a schematic configuration view showing a laser oscillator according to an embodiment of the present invention.

A laser oscillator according to one embodiment of the present invention will be described with reference to the drawings. FIG. 1 is a schematic configuration view showing a laser oscillator according to the one embodiment of the present invention. A laser oscillator 1 of this embodiment includes multiple (in the illustration of FIG. 1, three) semiconductor laser modules 10 (11, 12, 13). Laser beams are supplied from these semiconductor laser modules 10 (11, 12, 13) to a resonator 30 or a combiner 30 (resonator 31, combiner 32) through optical fibers 20 (21, 22, 23). In a system including the resonator 31, the laser beams from the semiconductor laser modules 10 (11, 12, 13) are used as excitation beams of the resonator 31. In a system including only the combiner 32, the laser beams from the multiple semiconductor laser modules 11, 12, and 13 are focused by the combiner 32 to become one beam, which is then used. There is also a system including both the resonator 31 and the combiner 32. The laser oscillator 1 of any of these systems emits a laser beam through an output optical fiber 40.

Figure 2:
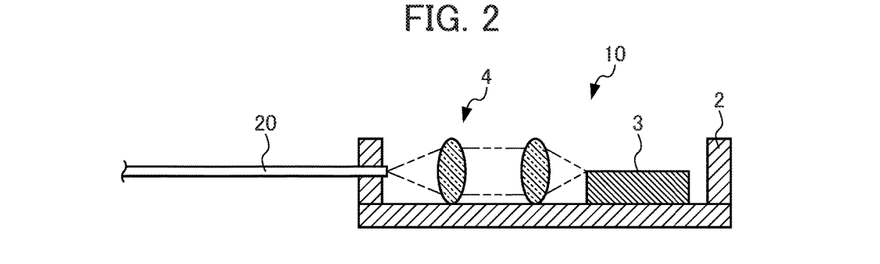
FIG. 2 is a schematic side sectional view showing a semiconductor laser module of the laser oscillator in FIG. 1.

FIG. 2 is a schematic side sectional view showing the semiconductor laser module of the laser oscillator in FIG. 1. The semiconductor laser module 10 includes a semiconductor laser element 3 and a lens 4 housed in a housing 2. An optical fiber 20 is derived from the housing 2. A laser beam emitted from the semiconductor laser element 3 is coupled to the optical fiber 20 at the lens 4.

Figure 3A:
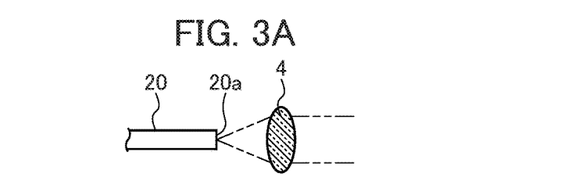
FIG. 3A describes a state where the coupling efficiency of the semiconductor laser module is not degraded.
Figure 3B:
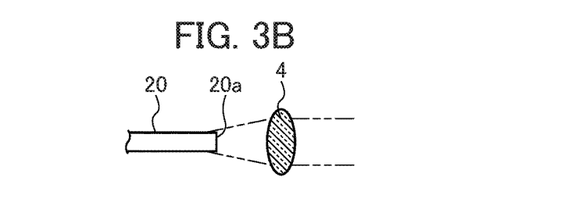
FIG. 3B describes a state where the coupling efficiency of the semiconductor laser module is degraded.

FIG. 3A describes a state where the coupling efficiency of the semiconductor laser module is not degraded. As shown in FIG. 3A, if the semiconductor laser element 3 is in a normal temperature range, a laser beam from the semiconductor laser element 3 is input to the inside of the optical fiber 20 through an end surface 20a of the optical fiber 20 and propagates through the optical fiber 20. In the state shown in FIG. 3A, the coupling efficiency of the semiconductor laser module is not degraded. FIG. 3B describes a state where the coupling efficiency of the semiconductor laser module is degraded. As shown in FIG. 3B, if an output from the semiconductor laser element 3 increases, the lens 4 generates more heat. This changes the shape and the refractive index of the lens 4 and changes focal distance. Hence, the lens 4 focuses a laser beam on a position shifted from the end surface 20a of the optical fiber 20 to degrade the efficiency of coupling of the laser beam from the semiconductor laser element 3 to the optical fiber 20. This phenomenon becomes more noticeable by the use of a plastic lens than by the use of a glass lens.

Figure 4:
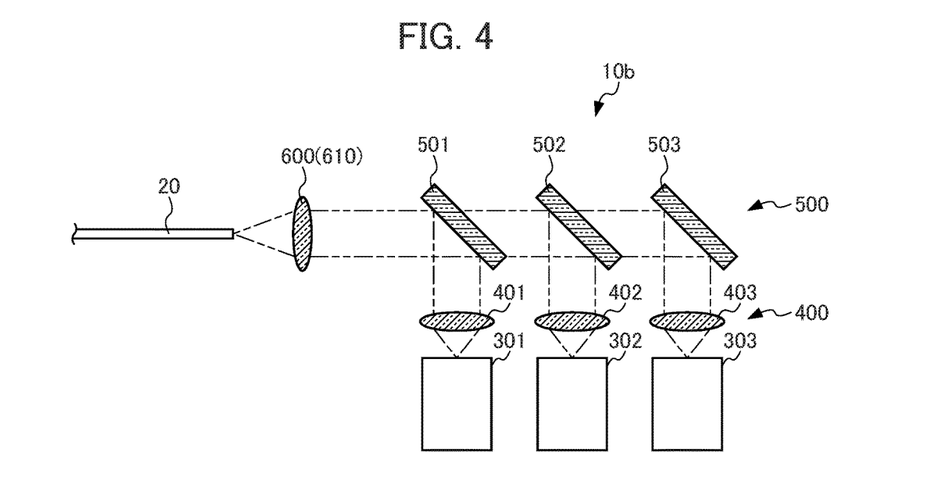
FIG. 4 is a schematic plan view showing the semiconductor laser module of the laser oscillator in FIG. 1.

FIG. 4 is a schematic plan view showing the semiconductor laser module of the laser oscillator in FIG. 1. The semiconductor laser module 10b in FIG. 4 includes multiple (in the illustration of FIG. 4, three) semiconductor laser elements 301, 302, and 303. The semiconductor laser module 10b further includes: lenses 400 (401, 402, 403) in a first group for causing laser beams from the corresponding semiconductor laser elements 301, 302, and 303 to pass through; mirrors 500 (501, 502, 503) for bending optical axes of beams having passed through the corresponding lenses 400 (401, 402, 403) in the first group at a right angle; and a lens 600 (610) in a second group for causing all beams reflected off the mirrors 501, 502, and 503 to pass through. The laser beams from the semiconductor laser elements 301, 302, and 303 are guided individually by the lenses 400 (401, 402, 403) in the first group and the mirrors 501, 502, and 503 to the lens 600 (610) in the second group. Then, the guided laser beams are focused by the lens 600 (610) in the second group and coupled to the optical fiber 20. In this example, the lens 600 (610) in the second group is a single lens.

As described above, each of the lenses 400 (401, 402, 403) in the first group causes only a laser beam from a corresponding semiconductor laser element from the semiconductor laser elements 301, 302, and 303 to pass through. In contrast, the lens 600 (610) in the second group of this embodiment causes laser beams from all the semiconductor laser elements 301, 302, and 303 to pass through (all these laser beams are focused by the lens 600 (610) in the second group). Thus, the lenses 400 (401, 402, 403) in the first group are exposed to relatively low energy, whereas the lens 600 (610) in the second group is exposed to relatively high energy. As a result, the lenses 400 (401, 402, 403) in the first group experience a relatively small temperature increase, whereas the lens 600 (610) in the second group experiences a relatively remarkable temperature increase.

In this embodiment of the present invention, plastic lenses are used as the lenses 400 (401, 402, 403) in the first group. Further, a glass lens is used as the lens 600 (610) in the second group. The plastic lens may be made of resin with silicone or polyester, for example. As described above, the lenses 400 (401, 402, 403) in the first group are plastic lenses, enabling them to be designed freely in terms of shape. For example, the lenses 400 (401, 402, 403) in the first group can be designed to have an optimal shape such as an aspherical shape. This brings about an effect that more than makes up for a degradation of coupling efficiency caused by a change in focal position so that the coupling efficiency of the laser oscillator as a whole can be increased.

Figure 5:
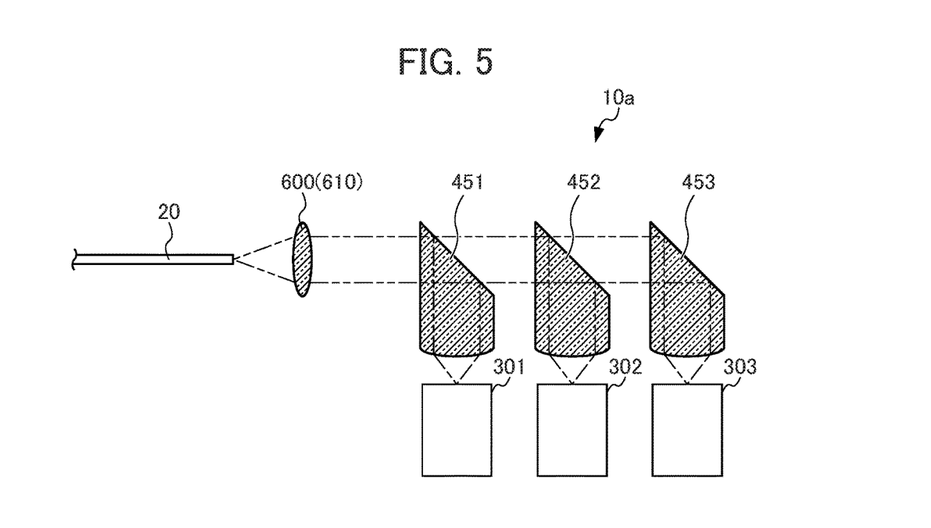
FIG. 5 is a schematic plan view showing a semiconductor laser module of a laser oscillator according to a different embodiment of the present invention.

FIG. 5 is a schematic plan view showing a semiconductor laser module of a laser oscillator according to a different embodiment of the present invention. Units of FIG. 5 corresponding to those of FIG. 4 are identified by the same signs. The embodiment of FIG. 5 differs from the embodiment of FIG. 4 in that the semiconductor laser module 10a in FIG. 5 includes a composite optical element 451, a composite optical element 452, and a composite optical element 453. Each of the composite optical elements 451, 452, and 453 is an integration between a functional unit functioning as the lens 400 (401, 402, 403) in the first group to which a laser beam from each of the semiconductor laser elements 301, 302, and 303 described above by referring to FIG. 4 is to be input, and a functional unit functioning as the mirrors 501, 502, and 503 for reflecting the laser beams from the semiconductor laser elements 301, 302, and 303. These composite optical elements 451, 452, and 453 of this embodiment are also made of plastic.

The functional unit functioning as the lens 400 (401, 402, 403) in the first group and the functional unit functioning as the mirror 500 (501, 502, 503) are integrated. This reduces the number of parts. Further, the position of the functional unit functioning as the lenses 400 (401, 402, 403) in the first group and the position of the functional unit functioning as the mirror 500 (501, 502, 503) can be adjusted simultaneously, thereby contributing to a reduction in man-hour required for adjustment.

Figure 6:
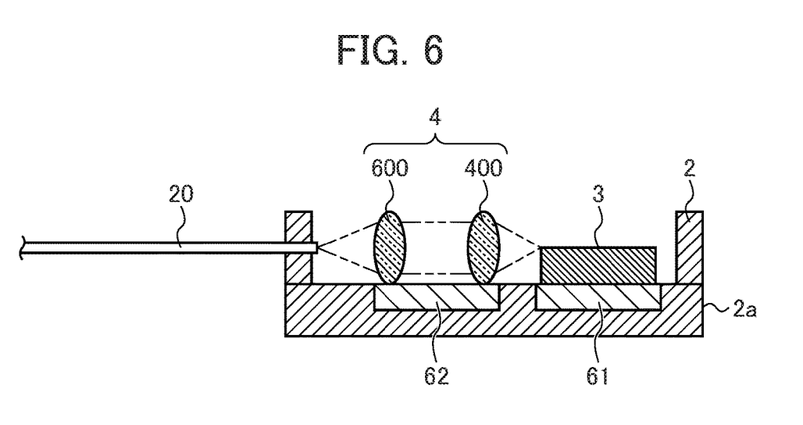
FIG. 6 is a schematic side sectional view showing a semiconductor laser module of a laser oscillator according to a still different embodiment of the present invention.

FIG. 6 is a schematic side sectional view showing a semiconductor laser module of a laser oscillator according to a still different embodiment of the present invention. In the embodiment of FIG. 6, the semiconductor laser element 3 and the lens 4 are arranged on cooling mechanisms, which are separate temperature adjustment units. Specifically, the embodiment of FIG. 6 includes a semiconductor laser element temperature adjustment unit 61 for temperature adjustment of the semiconductor laser element 3, and a lens temperature adjustment unit 62 for temperature adjustment of the lens 4 (lens 400 in the first group and/or lens 600 in the second group). The lens temperature adjustment unit 62 controls the temperature of the lens in response to an output from the semiconductor laser element 3 independently of the semiconductor laser element temperature adjustment unit 61.

Peltier elements are usable as the cooling mechanisms at the semiconductor laser element temperature adjustment unit 61 and the lens temperature adjustment unit 62. These Peltier elements are provided at a base unit 2a of the housing 2. Controlling these cooling mechanisms using a control unit (not shown in the drawings) allows the semiconductor laser element temperature adjustment unit 61 and the lens temperature adjustment unit 62 to be controlled individually in temperature. If an output of a laser beam from the semiconductor laser element 3 is high, the semiconductor laser element temperature adjustment unit 61 and the lens temperature adjustment unit 62 are controlled so as to reduce the temperature of the lens 4 (lens 400 in the first group and/or lens 600 in the second group). This prevents degradation of the efficiency of coupling of a laser beam from the semiconductor laser element 3 to the optical fiber 20.

Figure 7:
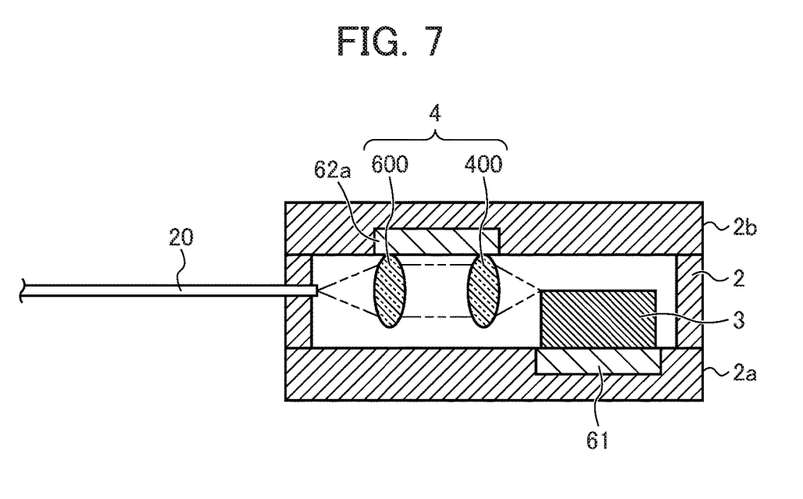
FIG. 7 is a schematic side sectional view showing a semiconductor laser module of a laser oscillator according to a still different embodiment of the present invention.

FIG. 7 is a schematic side sectional view showing a semiconductor laser module of a laser oscillator according to a still different embodiment of the present invention. In the illustration of FIG. 7, the semiconductor laser element 3 is fixed to the base unit 2a forming a lower part of the housing 2, whereas the lens 4 (lens 400 in the first group and/or lens 600 in the second group) is fixed to a lid member 2b forming an upper part of the housing 2. Like in the illustration of FIG. 6, the semiconductor laser element temperature adjustment unit 61 is provided at the base unit 2a of the housing 2. Meanwhile, a lens temperature adjustment unit 62a is provided at the lid member 2b in response to the arrangement of the lens 4. In this embodiment, heat generated by the semiconductor laser element 3 becomes unlikely to be transferred to the lens 4. This makes it possible to prevent degradation of coupling efficiency while enhancing performance in temperature control by a cooling mechanism (a Peltier element, for example) as the lens temperature adjustment unit 62a.

Figure 8:
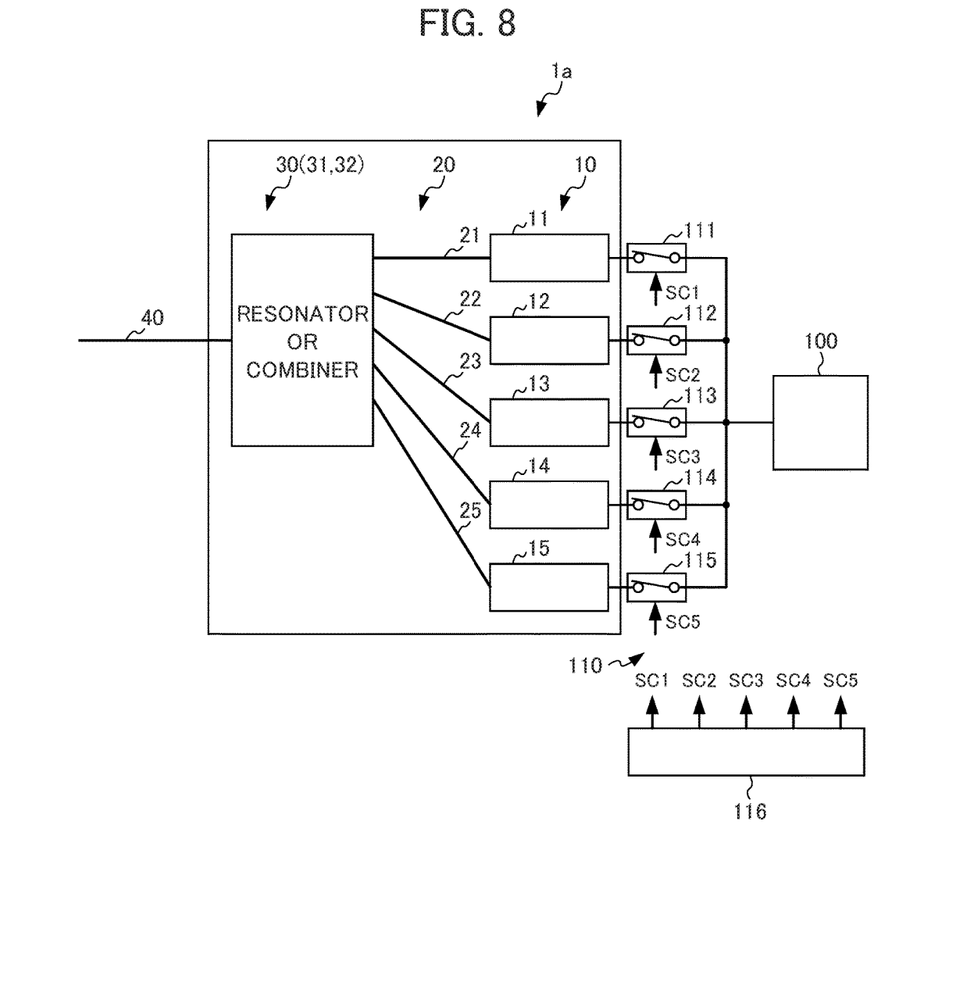
FIG. 8 is a schematic configuration view showing a laser oscillator according to a different embodiment of the present invention.

FIG. 8 is a schematic configuration view showing a laser oscillator according to a different embodiment of the present invention. Referring to FIG. 8, a laser oscillator 1a includes multiple (in the illustration of FIG. 8, five) semiconductor laser modules 10 (11, 12, 13, 14, 15). Laser beams are supplied from these semiconductor laser modules 10 (11, 12, 13, 14, 15) to a resonator 30 or a combiner 30 (resonator 31, combiner 32) through optical fibers 20 (21, 22, 23, 24, 25). Like in the description of the embodiment of FIG. 1 given above, in a system including the resonator 31, the laser beams from the semiconductor laser modules 10 (11, 12, 13, 14, 15) are used as excitation beams of the resonator 31. In a system including only the combiner 32, the laser beams from the multiple semiconductor laser modules 11, 12, 13, 14, and 15 are focused by the combiner 32 to become one beam and then used. There is also a system including both the resonator 31 and the combiner 32. The laser oscillator 1a of any of these systems emits a laser beam through an output optical fiber 40.

The embodiment of FIG. 8 includes a module drive unit 110 for driving the multiple semiconductor laser modules 11, 12, 13, 14, and 15 individually. The module drive unit 110 includes a switch part 111, a switch part 112, a switch part 113, a switch part 114, and a switch part 115 interposed in circuits for supplying excitation currents from a power supply unit 100 to the corresponding semiconductor laser modules 11, 12, 13, 14, and 15, and a control signal generator 116 for generating a control signal SC1, a control signal SC2, a control signal SC3, a control signal SC4, and a control signal SC5 used for controlling the corresponding switch parts 111, 112, 113, 114, and 115.

The module drive unit 110 applies the following two control modes selectively to each of the multiple semiconductor laser modules 11, 12, 13, 14, and 15 and executes the applied mode: a rated drive mode of driving each of the semiconductor laser modules 11, 12, 13, 14, and 15 so as to make each of the semiconductor laser modules 11, 12, 13, 14, and 15 produce a rated output (a mode of turning on a corresponding switch part); and a stop mode of not driving each of the semiconductor laser modules 11, 12, 13, 14, and 15 (a mode of turning off a corresponding switch part).

Specifically, the semiconductor laser module 10 (11, 12, 13, 14, 15) is placed only in two states, a state where an output is OFF, and a state where a rated output is ON. Thus, a lens or a mirror of the semiconductor laser module 10 (11, 12, 13, 14, 15) is required to be adjusted only in the state of the rated output. In this case, if an output is half of the rated output, coupling efficiency is not optimized. However, in principle, this does not give rise to any problem as the semiconductor laser module 10 (11, 12, 13, 14, 15) is used only while producing the rated output. Control over a laser output from the laser oscillator 1a as a whole becomes discrete output control. However, the high coupling efficiency of the semiconductor laser module 10 (11, 12, 13, 14, 15) makes it possible to form a highly efficient laser oscillator.

A laser oscillator can be configured as follows according to a modification of the embodiment of FIG. 8. In the embodiment of FIG. 8, the module drive unit 110 drives each of the multiple semiconductor laser modules 10 (11, 12, 13, 14, 15) by applying the following two control modes selectively to each of the multiple semiconductor laser modules 10: the rated drive mode of driving each of the semiconductor laser modules 10 so as to make each of the semiconductor laser modules 10 produce a rated output; and the stop mode of not driving each of the semiconductor laser modules 10. Meanwhile, the rated drive mode may be replaced by a near rated drive mode of driving each of the multiple semiconductor laser modules 10 so as to make each of the multiple semiconductor laser modules 10 produce an output near a rated output. More specifically, in the near rated drive mode, control is exerted to produce an output near a rated output such as an output plus or minus 10 percent of the rated output. This may be achieved if the module drive unit 110 in FIG. 8 is configured so as to control turning on and off of the switch parts 111, 112, 113, 114, and 115 and adjust an output from the power supply unit 100 at the same time, for example.

In this case, by adjusting a lens or a mirror of the semiconductor laser module 10 (11, 12, 13, 14, 15) while the semiconductor laser module 10 (11, 12, 13, 14, 15) is in the state of producing a rated output, degradation of coupling efficiency can also be reduced if an output is plus or minus 10 percent of the rated output. A laser output from a laser oscillator as a whole can be controlled more smoothly so that the performance of laser cutting using this laser oscillator and the quality of the laser cutting are both increased.

A laser oscillator can be configured as follows according to a different modification of the embodiment of FIG. 8. In the embodiment of FIG. 8, the two drive modes including the rated drive mode and the stop mode are prepared for the semiconductor laser modules 11, 12, 13, 14, and 15, and applied selectively to each of the semiconductor laser modules 11, 12, 13, 14, and 15. Further, the specifications (rated outputs) of the semiconductor laser modules 11, 12, 13, 14, and 15 are the same. In contrast, according to a different modification, the semiconductor laser modules 10 (11, 12, 13, 14, 15) include semiconductor laser modules of different rated outputs to form a semiconductor laser module group.

As a specific example, the semiconductor laser module group includes both a semiconductor laser module with a rated output of 50 W and a semiconductor laser module with a rated output of 100 W. In this case, with the use of only the semiconductor laser module with a rated output of 100 W, a laser output from a laser oscillator can be controlled only in units of 100 W. Meanwhile, as a result of the addition of the semiconductor laser module with a rated output of 50 W, the laser output can be controlled in units of 50 W. If the semiconductor laser module group includes a semiconductor laser module with a rated output of 10 W or less, for example, the laser output can be controlled more finely.

Figure 9:
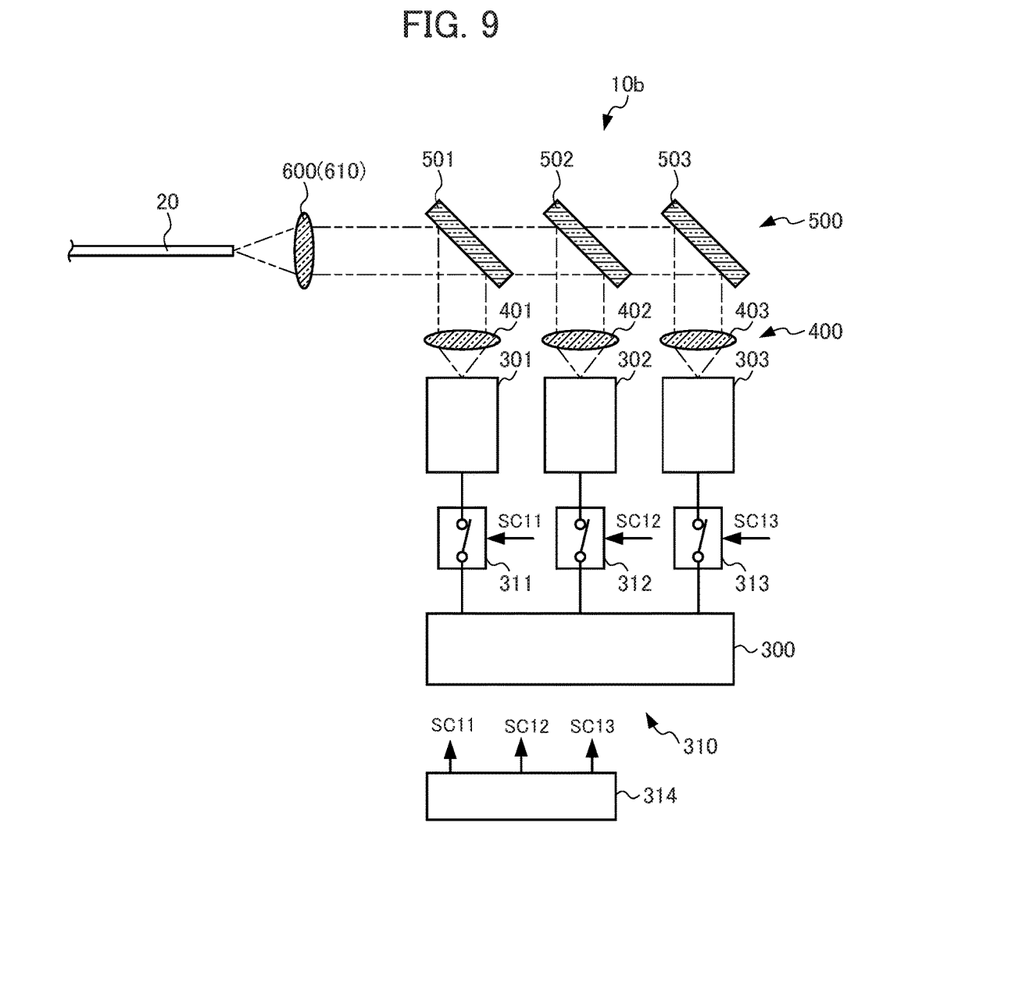
FIG. 9 is a schematic configuration view showing a semiconductor laser module of a laser oscillator according to a different embodiment of the present invention.

FIG. 9 is a schematic configuration view showing a semiconductor laser module of a laser oscillator according to a different embodiment of the present invention. Units of FIG. 9 corresponding to those of FIG. 4 referred to above are identified by the same signs. These corresponding units will not be described below. The embodiment of FIG. 9 includes a semiconductor laser element drive unit 310 for driving the multiple semiconductor laser elements 301, 302, and 303 individually. The semiconductor laser element drive unit 310 includes a switch part 311, a switch part 312, and a switch part 313 interposed in circuits for supplying excitation currents from a power supply unit 300 to the corresponding semiconductor laser elements 301, 302, and 303, and a control signal generator 314 for generating a control signal SC11, a control signal SC12, and a control signal SC13 used for controlling the corresponding switch parts 311, 312, and 313.

The semiconductor laser element drive unit 310 applies the following two control modes selectively to each of the multiple semiconductor laser elements 301, 302, and 303 and executes the applied mode: a rated drive mode of driving each of the semiconductor laser elements 301, 302, and 303 so as to make each of the semiconductor laser elements 301, 302, and 303 produce a rated output (a mode of turning on a corresponding switch part); and a stop mode of not driving each of the semiconductor laser elements 301, 302, and 303 (a mode of turning off a corresponding switch part). The rated output of each of the semiconductor laser elements 301, 302, and 303 is smaller than the rated output of the semiconductor laser module 10 (11, 12, 13, 14, 15). Thus, a laser output from the laser oscillator as a whole can be controlled more smoothly.

Figure 10:
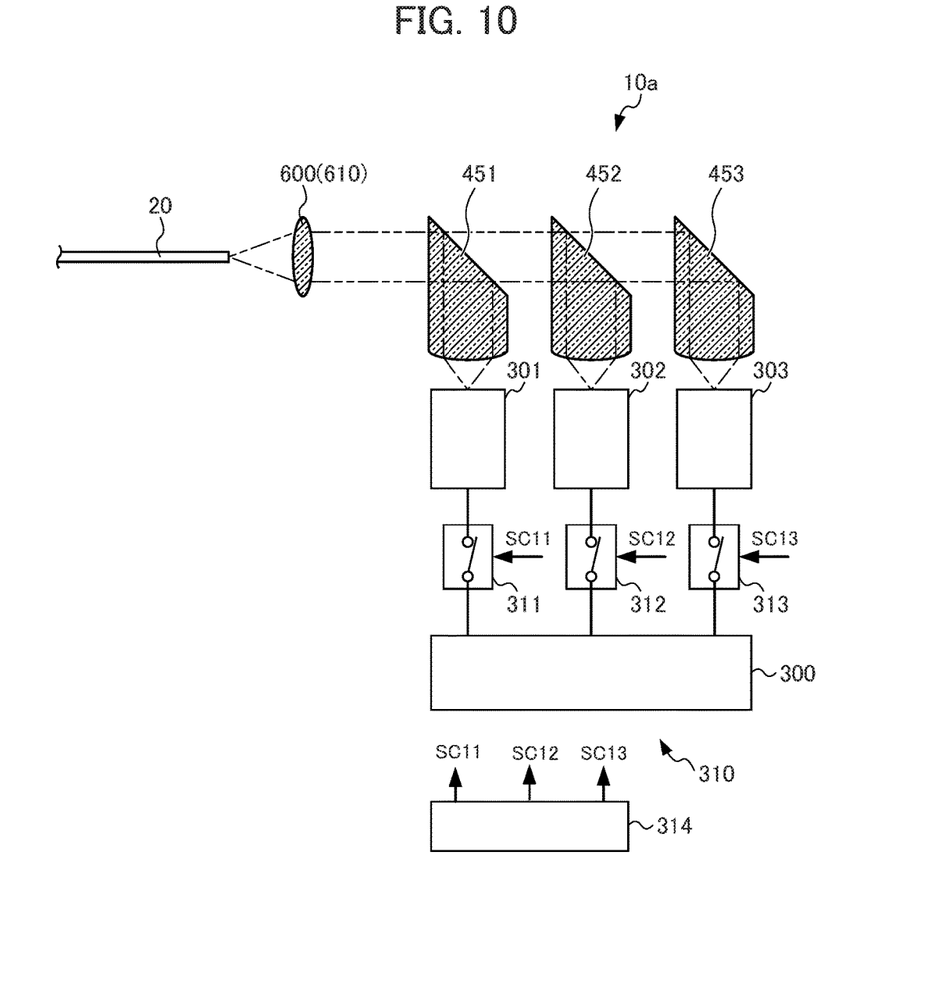
FIG. 10 is a schematic configuration view showing a semiconductor laser module of a laser oscillator according to a still different embodiment of the present invention.

FIG. 10 is a schematic configuration view showing a semiconductor laser module of a laser oscillator according to a still different embodiment of the present invention. Units of FIG. 10 corresponding to those of FIGS. 5 and 9 referred to above are identified by the same signs. These corresponding units will not be described below. As understood from comparison of FIG. 10 with FIGS. 5 and 9 referred to above, the embodiment of FIG. 10 has the same configuration as that of FIG. 9 where the semiconductor laser element drive unit 310 drives the multiple semiconductor laser elements 301, 302, and 303 individually. A difference from FIG. 9 is that lenses and mirrors are replaced by composite optical elements 451, 452, and 453. Each of the composite optical elements 451, 452, and 453 is an integration between a functional unit functioning as the lens 400 (401, 402, 403) in the first group in FIG. 9, and a functional unit functioning as mirrors 501, 502, and 503 in FIG. 9 for reflecting laser beams from the semiconductor laser elements 301, 302, and 303. The configuration with the composite optical elements 451, 452, and 453 is the same as the configuration described above by referring to FIG. 5. The embodiment of FIG. 10 realizes a laser oscillator having both the above-described advantages of the embodiments of FIGS. 5 and 9.

In the embodiments described above by referring to the drawings, the semiconductor laser module 10 or 10b is allowed to have a configuration where the position of the semiconductor laser element 3 mounted in the semiconductor laser module 10 or 10b and that of a corresponding lens from the lenses 400 in the first group mounted in the semiconductor laser module 10 or 10b relative to each other are adjusted so as to achieve maximum coupling efficiency when the semiconductor laser module 10 or 10b produces a rated output. By setting the position of the semiconductor laser element 3 and that of a corresponding lens from the lenses 400 in the first group relative to each other in this way, coupling efficiency is maximized at all times, particularly if the semiconductor laser module 10 or 10b is used for producing a rated output.

The configuration, action, and effect of the laser oscillator according to the embodiments of the present invention described above by referring to the drawings will be summarized as follows. (1) The laser oscillator according to the embodiments of the present invention is the laser oscillator 1 including the semiconductor laser module 10 (11 to 13 or 11 to 15) with the multiple semiconductor laser elements 3 (301, 302, 303). The laser oscillator 1 includes: the multiple lenses 400 (401, 402, 403) in the first group provided in the semiconductor laser module 10 (11 to 13 or 11 to 15) for causing laser beams from the semiconductor laser elements 3 (301, 302, 303) to pass through; and the lens 600 (610) in the second group provided in the semiconductor laser module 10 for causing all beams having passed through the multiple lenses 400 (401, 402, 403) in the first group to pass through. The lenses 400 (401, 402, 403) in the first group are plastic lenses. The lens 600 (610) in the second group is a glass lens.

In the laser oscillator described in (1), a glass lens is used as the lens 600 (610) in the second group as it is to exposed to relatively high energy and experiences a remarkable increase in temperature as a result. Further, plastic lenses are used as the lenses 400 (401, 402, 403) in the first group as they are exposed to relatively low energy and experience a small increase in temperature as a result. By doing so, a highly reliable laser oscillator can be provided at a low cost. Using plastic lenses as the lenses 400 (401, 402, 403) in the first group allows the lenses 400 to be designed freely in terms of shape. For example, the lenses 400 can be designed to have an optimal shape such as an aspherical shape. This brings about an effect that more than makes up for a degradation of coupling efficiency caused by a change in focal position so that the coupling efficiency of the laser oscillator as a whole can be increased.

(2) In one aspect of the laser oscillator according to the embodiments of the present invention, the semiconductor laser module 10 (11 to 13 or 11 to 15) further includes the mirror 500 (501, 502, 503) for reflecting a laser beam from each of semiconductor laser elements 301, 302, and 303. The lens 400 (401, 402, 403) in the first group and the mirror 500 (501, 502, 503) are integrated.

In the laser oscillator described in (2), a functional unit functioning as the lens 400 (401, 402, 403) in the first group and a functional unit functioning as the mirror 500 (501, 502, 503) are integrated. This reduces the number of parts. Further, the position of the functional unit functioning as the lens 400 (401, 402, 403) in the first group and the position of the functional unit functioning as the mirror 500 (501, 502, 503) can be adjusted simultaneously. This contributes to a reduction in man-hour required for adjustment, leading to cost reduction.

(3) In one aspect of the laser oscillator according to the embodiments of the present invention, the laser oscillator includes the semiconductor laser element temperature adjustment unit 61 for temperature adjustment of the semiconductor laser elements 3, and the lens temperature adjustment unit 62 for temperature adjustment of the lens 4 (lens 400 in the first group and/or lens 600 in the second group). The lens temperature adjustment unit 62 controls the temperature of the lens in response to an output from the semiconductor laser element 3 independently of the semiconductor laser element temperature adjustment unit 61.

In the laser oscillator described in (3), the temperature of the lens 4 (lens 400 in the first group and/or lens 600 in the second group) is adjusted in response to an output from the semiconductor laser element 3. This eliminates a change in the focal distance of the lens caused by a change in temperature and makes it possible to maintain high coupling efficiency of the semiconductor laser module.

(4) In one aspect of the laser oscillator according to the embodiments of the present invention, the laser oscillator includes the module drive unit 110 for driving the multiple semiconductor laser modules 11, 12, 13, 14, and 15 individually. The module drive unit 110 applies the following two control modes selectively to each of the multiple semiconductor laser modules 11, 12, 13, 14, and 15 and executes the applied mode: the rated drive mode of driving each of the semiconductor laser modules 11, 12, 13, 14, and 15 so as to make each of the semiconductor laser modules 11, 12, 13, 14, and 15 produce a rated output; and the stop mode of not driving each of the semiconductor laser modules 11, 12, 13, 14, and 15.

In the laser oscillator described in (4), each of the semiconductor laser modules 11, 12, 13, 14, and 15 is only driven to produce a constant output. Thus, there is no change in coupling efficiency caused by a change in output.

(5) In one aspect of the laser oscillator according to the embodiments of the present invention, the laser oscillator includes the module drive unit 110 for driving the multiple semiconductor laser modules 11, 12, 13, 14, and 15 individually. The module drive unit 110 applies the following two control modes selectively to each of the multiple semiconductor laser modules 11, 12, 13, 14, and 15 and executes the applied mode: the near rated drive mode of driving each of the semiconductor laser modules 11, 12, 13, 14, and 15 so as to make each of the semiconductor laser modules 11, 12, 13, 14, and 15 produce an output near a rated output; and the stop mode of not driving each of the semiconductor laser modules 11, 12, 13, 14, and 15.

In the laser oscillator described in (5), each of the semiconductor laser modules 11, 12, 13, 14, and 15 is only driven to produce a nearly constant output. Thus, there is no change in coupling efficiency caused by a change in output. An output is controlled in a range near a rated output to achieve fine control over a laser output from the laser oscillator as a whole.

(6) In one aspect of the laser oscillator according to the embodiments of the present invention, the multiple semiconductor laser modules 11, 12, 13, 14, and 15 include semiconductor laser modules of different rated outputs to form a semiconductor laser module group.

In the laser oscillator described in (6), the semiconductor laser module group includes semiconductor laser modules of different rated outputs to increase types of output combinations. This achieves fine control over a laser output from the laser oscillator as a whole.

(7) In one aspect of the laser oscillator according to the embodiments of the present invention, the semiconductor laser module 10a or 10b includes the multiple semiconductor laser elements 301, 302, and 303, and the semiconductor laser element drive unit 310 for driving the multiple semiconductor laser elements 301, 302, and 303 individually. The semiconductor laser element drive unit 310 applies the following two control modes selectively to each of the multiple semiconductor laser elements 301, 302, and 303 and executes the applied mode: the rated drive mode of driving each of the semiconductor laser elements 301, 302, and 303 so as to make each of the semiconductor laser elements 301, 302, and 303 produce a rated output; and the stop mode of not driving each of the semiconductor laser elements 301, 302, and 303.

In the laser oscillator described in (7), an output is controlled based on the number of the semiconductor laser elements to be driven. Thus, a laser output can be controlled more finely than in the case of controlling an output based on the number of the semiconductor laser modules to be driven.

(8) In one aspect of the laser oscillator according to the embodiments of the present invention, the position of the semiconductor laser element 3 mounted on the semiconductor laser module 10 or 10b and that of a corresponding lens from the lenses 400 in the first group mounted on the semiconductor laser module 10 or 10b relative to each other are set so as to achieve maximum coupling efficiency when the semiconductor laser module 10 or 10b produces a rated output.

In the laser oscillator described in (8), by adjusting the position of the semiconductor laser element 3 and that of the lens 400 in the first group relative to each other at a rated output, high coupling efficiency can be obtained.

As described above, according to the embodiments of the present invention, plastic lenses are used in the laser oscillator. A plastic lens can be designed freely in terms of shape, enabling it to be formed into a shape that is optimized for the optical design of the semiconductor laser module. As a result, high coupling efficiency can be obtained. Further, by forming the lenses into an integrated shape, the number of lenses can be reduced to allow a reduction in laser loss. This contributes to an increase in both the efficiency and output of the laser oscillator.

Further, a plastic lens requires consideration in terms of heat resistance, and its optical characteristics change greatly with a change in temperature. Thus, in the embodiments of the present invention, plastic lenses are arranged at a position of low laser strength (a position where they are not exposed to relatively high energy). For the use of plastic lenses, the strength of a laser that passes through them is always maintained at a constant level if such a need arises, for example. In other words, plastic lenses are used at a position where they can be used without hindrance in terms of conditions of use and is used suitably for taking advantage of the characteristics of the lens, thereby achieving an increase in both the efficiency and output of the laser oscillator.

The present invention is not to be limited to the above-described embodiments and is feasible with various modifications or changes. Modifications or improvements are also covered by the present invention, as long as such modifications or improvements fall in a range in which the object of the present invention can be achieved. For example, multiple semiconductor laser modules are provided in the embodiments. However, the present invention is not limited to this point. The present invention is feasible as an embodiment where one semiconductor laser module is provided in one laser oscillator.

EXPLANATION OF REFERENCE NUMERALS

1, 1a Laser oscillator
3, 301, 302, 303 Semiconductor laser element
10, 10a, 10b, 11, 12, 13, 14, 15 Semiconductor laser module 61 Semiconductor laser element temperature adjustment unit
62 Lens temperature adjustment unit
110 Module drive unit
310 Semiconductor laser element drive unit
400, 401, 402, 403 Lens in first group
451, 452, 453 Composite optical element
500, 501, 502, 503 Mirror
600, 610 Lens in second group

What is claimed is:

1. A laser oscillator comprising a semiconductor laser module with multiple semiconductor laser elements, the laser oscillator comprising:
    multiple lenses in a first group provided in the semiconductor laser module, each one of the multiple lenses positioned to receive one of a plurality of laser beams from a respective one of the semiconductor laser elements by way of a separate optical axis;
    a lens in a second group provided in the semiconductor laser module, the lens in the second group positioned to receive each one of the plurality of laser beams from the multiple lenses along a common optical axis and to transmit each one of the plurality of laser beams along the common optical axis; and
    a mirror positioned to receive one of the plurality of laser beams from one separate optical axis and positioned to reflect the one of the plurality of laser beams along the common optical axis, a lens in the first group integrated with the mirror to form a composite optical element having a curved input surface, an output surface, and a reflective surface, the curved input surface positioned along the one separate optical axis, the output surface positioned along the common optical axis, and the mirror positioned along both the one separate optical axis and the common optical axis.

2. The laser oscillator according to claim 1, comprising a semiconductor laser element temperature adjustment unit for temperature adjustment of the semiconductor laser elements, and a lens temperature adjustment unit for temperature adjustment of the lenses in the first group and/or the lens in the second group, wherein
    the lens temperature adjustment unit controls the temperatures of the lenses in response to an output from each of the semiconductor laser elements independently of the semiconductor laser element temperature adjustment unit.

3. The laser oscillator according to claim 1, wherein the semiconductor laser module includes multiple semiconductor laser modules, the laser oscillator comprises a module drive unit for driving the multiple semiconductor laser modules individually, and
    the module drive unit applies two control modes selectively to each of the multiple semiconductor laser modules and executes the applied mode, the two control modes including a rated drive mode of driving each of the semiconductor laser modules so as to make each of the semiconductor laser modules produce a rated output, and a stop mode of not driving each of the semiconductor laser modules.

4. The laser oscillator according to claim 3, wherein the multiple semiconductor laser modules include semiconductor laser modules of different rated outputs to form a semiconductor laser module group.

5. The laser oscillator according to claim 1, wherein the semiconductor laser module includes multiple semiconductor laser modules, the laser oscillator comprises a module drive unit for driving the multiple semiconductor laser modules individually, and
    the module drive unit applies two control modes selectively to each of the multiple semiconductor laser modules and executes the applied mode, the two control modes including a near rated drive mode of driving each of the semiconductor laser modules so as to make each of the semiconductor laser modules produce an output near a rated output, and a stop mode of not driving each of the semiconductor laser modules.

6. The laser oscillator according to claim 1, wherein the semiconductor laser module includes multiple semiconductor laser elements and a semiconductor laser element drive unit for driving the multiple semiconductor laser elements individually, and
    the semiconductor laser element drive unit applies two control modes selectively to each of the multiple semiconductor laser elements and executes the applied mode, the two control modes including a rated drive mode of driving each of the semiconductor laser elements so as to make each of the semiconductor laser elements produce a rated output, and a stop mode of not driving each of the semiconductor laser elements.

7. The laser oscillator according to claim 1, wherein the position of each of the semiconductor laser elements mounted on the semiconductor laser module and that of a corresponding lens from the lenses in the first group mounted on the semiconductor laser module relative to each other are set so as to achieve maximum coupling efficiency when the semiconductor laser module produces a rated output.

8. The laser oscillator according to claim 1, further including a housing having a base and a lid positioned on opposite side of the housing, wherein the multiple semiconductor lasers elements are positioned on one of the base and the lid and the lenses are positioned on the other of the base and the lid.

9. The laser oscillator according to claim 8, including a semiconductor laser element temperature adjustment unit for temperature adjustment of the semiconductor laser elements, the semiconductor laser element temperature adjustment unit positioned on the same one of the base and the lid as the multiple semiconductor laser elements, and a lens temperature adjustment unit for temperature adjustment of the lenses in the first group and/or the lens in the second group, the lens temperature adjustment unit positioned on the same one of the base and lid as the lenses, wherein
    the lens temperature adjustment unit controls the temperatures of the lenses in response to an output from each of the semiconductor laser elements independently of the semiconductor laser element temperature adjustment unit.

10. The laser oscillator according to claim 1, wherein at least one of the multiple lenses in the first group is formed of a plastic, and the lens in the second group is formed of a glass.

11. A laser oscillator comprising a semiconductor laser module with multiple semiconductor laser elements, the laser oscillator comprising:
    multiple lenses in a first group provided in the semiconductor laser module, each one of the multiple lenses positioned to receive one of a plurality of laser beams from a respective one of the semiconductor laser elements by way of a respective separate optical axis, and each lens in the first group is integrated with a mirror to form a composite optical element having a curved input surface, an output surface, and a reflective surface, each curved input surface positioned along the respective separate optical axis, each output surface positioned along a common optical axis, and the mirror positioned along both the respective separate optical axis and the common optical axis; and a lens in a second group provided in the semiconductor laser module, the lens in the second group positioned to receive each one of the plurality of laser beams from the multiple lenses along the common optical axis and to transmit each one of the plurality of laser beams along the common optical axis.

12. The laser oscillator according to claim 11, comprising a semiconductor laser element temperature adjustment unit for temperature adjustment of the semiconductor laser elements, and a lens temperature adjustment unit for temperature adjustment of the lenses in the first group and/or the lens in the second group, wherein the lens temperature adjustment unit controls the temperatures of the lenses in response to an output from each of the semiconductor laser elements independently of the semiconductor laser element temperature adjustment unit.

13. The laser oscillator according to claim 11, wherein the semiconductor laser module includes multiple semiconductor laser modules, the laser oscillator comprises a module drive unit for driving the multiple semiconductor laser modules individually, and the module drive unit applies two control modes selectively to each of the multiple semiconductor laser modules and executes the applied mode, the two control modes including a rated drive mode of driving each of the semiconductor laser modules so as to make each of the semiconductor laser modules produce a rated output, and a stop mode of not driving each of the semiconductor laser modules.

14. The laser oscillator according to claim 13, wherein the multiple semiconductor laser modules include semiconductor laser modules of different rated outputs to form a semiconductor laser module group.

15. The laser oscillator according to claim 11, wherein the semiconductor laser module includes multiple semiconductor laser modules, the laser oscillator comprises a module drive unit for driving the multiple semiconductor laser modules individually, and the module drive unit applies two control modes selectively to each of the multiple semiconductor laser modules and executes the applied mode, the two control modes including a near rated drive mode of driving each of the semiconductor laser modules so as to make each of the semiconductor laser modules produce an output near a rated output, and a stop mode of not driving each of the semiconductor laser modules.

16. The laser oscillator according to claim 11, wherein the semiconductor laser module includes multiple semiconductor laser elements and a semiconductor laser element drive unit for driving the multiple semiconductor laser elements individually, and the semiconductor laser element drive unit applies two control modes selectively to each of the multiple semiconductor laser elements and executes the applied mode, the two control modes including a rated drive mode of driving each of the semiconductor laser elements so as to make each of the semiconductor laser elements produce a rated output, and a stop mode of not driving each of the semiconductor laser elements.

17. The laser oscillator according to claim 11, further including a housing having a base and a lid positioned on opposite side of the housing, wherein the multiple semiconductor lasers elements are positioned on one of the base and the lid and the lenses are positioned on the other of the base and the lid.

18. The laser oscillator according to claim 17, including a semiconductor laser element temperature adjustment unit for temperature adjustment of the semiconductor laser elements, the semiconductor laser element temperature adjustment unit positioned on the same one of the base and the lid as the multiple semiconductor laser elements, and a lens temperature adjustment unit for temperature adjustment of the lenses in the first group and/or the lens in the second group, the lens temperature adjustment unit positioned on the same one of the base and lid as the lenses, wherein the lens temperature adjustment unit controls the temperatures of the lenses in response to an output from each of the semiconductor laser elements independently of the semiconductor laser element temperature adjustment unit.

19. The laser oscillator according to claim 11, wherein at least one of the multiple lenses in the first group is formed of a plastic, and the lens in the second group is formed of a glass.

20. A laser oscillator comprising a semiconductor laser module with multiple semiconductor laser elements, the laser oscillator comprising:

multiple lenses in a first group provided in the semiconductor laser module, each one of the multiple lenses positioned to receive one of a plurality of laser beams from a respective one of the semiconductor laser elements by way of a separate optical axis;

a lens in a second group provided in the semiconductor laser module, the lens in the second group positioned to receive each one of the plurality of laser beams from the multiple lenses along a common optical axis and to transmit each one of the plurality of laser beams along the common optical axis;

a housing having a base and a lid positioned on opposite side of the housing, wherein the multiple semiconductor lasers elements are positioned on one of the base and the lid and the lenses are positioned on the other of the base and the lid; and a semiconductor laser element temperature adjustment unit for temperature adjustment of the semiconductor laser elements, the semiconductor laser element temperature adjustment unit positioned on the same one of the base and the lid as the multiple semiconductor laser elements, and a lens temperature adjustment unit for temperature adjustment of the lenses in the first group and/or the lens in the second group, the lens temperature adjustment unit positioned on the same one of the base and lid as the lenses, and the lens temperature adjustment unit controls the temperatures of the lenses in response to an output from each of the semiconductor laser elements independently of the semiconductor laser element temperature adjustment unit.

* * * * *